US012677440B2

(12) United States Patent
Cascino et al.

(10) Patent No.: US 12,677,440 B2
(45) Date of Patent: Jul. 7, 2026

(54) ELECTRONIC DEVICE WITH REDUCED SWITCHING OSCILLATIONS

(71) Applicant: STMICROELECTRONICS S.r.l., Agrate Brianza (IT)

(72) Inventors: Salvatore Cascino, Gravina di Catania (IT); Alfio Guarnera, Trecastagni (IT); Mario Giuseppe Saggio, Aci Bonaccorsi (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 501 days.

(21) Appl. No.: 18/188,359

(22) Filed: Mar. 22, 2023

(65) Prior Publication Data

US 2023/0317843 A1    Oct. 5, 2023

(30) Foreign Application Priority Data

Apr. 1, 2022    (IT) ........................ 102022000006485

(51) Int. Cl.
$$\begin{array}{ll} H10D\ 30/66 & (2025.01) \\ H10D\ 1/66 & (2025.01) \\ H10D\ 62/10 & (2025.01) \end{array}$$

(52) U.S. Cl.
CPC ............. H10D 30/665 (2025.01); H10D 1/66 (2025.01); H10D 62/105 (2025.01)

(58) Field of Classification Search
CPC ...... H10D 30/665; H10D 1/66; H10D 62/105; H10D 30/662; H10D 64/517;
(Continued)

(56) References Cited

U.S. PATENT DOCUMENTS

2004/0012049 A1    1/2004  Shirai et al.
2017/0373140 A1*  12/2017  Hirler .................. H10D 62/111
(Continued)

OTHER PUBLICATIONS

Huang et al., "Effects of Edge Termination using Dielectric Field Plates with Different 1 Dielectric Constants, Thicknesses and Bevel Angles," Department of Electrical and Computer Engineering, Rutgers University, 5 pages, 2014.
(Continued)

*Primary Examiner* — Shahed Ahmed
(74) *Attorney, Agent, or Firm* — Seed Intellectual Property Law Group LLP

(57) ABSTRACT

The present disclosure is directed to an electronic device including a semiconductor body having a first electrical conductivity and provided with a front side; an active area of the semiconductor body, accommodating the source and gate regions of the electronic device and configured to accommodate, in use, a conductive channel of the electronic device; and an edge region of the electronic device, surrounding the active area. The edge region accommodates at least in part: i) an edge termination region, having a second electrical conductivity opposite to the first electrical conductivity, extending into the semiconductor body at the front side; and ii) a gate connection terminal of conductive material, electrically coupled to the gate region, extending on the front side partially superimposed on the edge termination region and capacitively coupled with a portion of the semiconductor body adjacent and external to the edge termination region.

24 Claims, 8 Drawing Sheets

(58) Field of Classification Search
CPC ............... H10D 84/141; H10D 62/157; H10D
62/8325; H10D 64/519; H10D 30/66;
H10D 30/655; H10D 62/60–605; H01L
21/0445–0495
See application file for complete search history.

(56) References Cited

U.S. PATENT DOCUMENTS

| | | | |
|---|---|---|---|
| 2018/0019308 A1 | 1/2018 | Tarui et al. | |
| 2018/0174938 A1 | 6/2018 | Uchida | |
| 2021/0296446 A1 | 9/2021 | Shimizu et al. | |
| 2023/0092013 A1* | 3/2023 | Schulze | H01L 21/7806 |
| | | | 257/77 |
| 2024/0395924 A1 | 11/2024 | Cascino et al. | |
| 2025/0022874 A1* | 1/2025 | Nochida | H10D 8/411 |

OTHER PUBLICATIONS

Hofstetter et al., "Parasitic Turn-On of SiC MOSFETs—Turning a Bug into a Feature," 2 University of Bayreuth, Center of Energy Technology (ZET), 7 pages, 2020.
Liu et al., "Modeling and Analysis of SiC MOSFET Switching Oscillations," IEEE 3 Journal of Emerging and Selected Topics in Power Electronics, vol. 4, No. 3, 10 pages, 2016.

* cited by examiner

ELECTRONIC DEVICE WITH REDUCED SWITCHING OSCILLATIONS

BACKGROUND

Technical Field

The present disclosure relates to an electronic device, in particular a SiC MOSFET, with reduced switching oscillations.

Description of the Related Art

As known, semiconductor materials having a Wide Band Gap (WBG), in particular having an energy value Eg of the band gap higher than 1.1 eV, low on-state resistance ($R_{ON}$), a high thermal conductivity value, high operating frequency and high saturation value of the velocity of the conduction charges, are ideal for providing electronic components, such as for example diodes or transistors, in particular for power applications. A material having these characteristics, and for being used for the manufacturing of electronic components, is silicon carbide (SiC). In particular, silicon carbide, in its different polytypes (for example 3C—SiC, 4H—SiC, 6H—SiC), is preferable to silicon as regards the previously listed properties.

Electronic devices provided on a silicon carbide substrate, compared to similar devices provided on a silicon substrate, have several advantageous characteristics, such as for example a low output resistance in conduction, a low leakage current, high working temperature and high working frequencies.

WBG semiconductor devices may operate at high voltage, high temperature and high switching frequency. The SiC MOSFETs, which are among the most popular WBG power devices, have been extensively studied for fast switching power converters. However, the fast switching characteristics of SiC MOSFETs lead to undesired voltage and current oscillations during turn-ON and turn-OFF switching. The resulting voltage overload may damage the same device, increase power losses and introduce substantial noise due to electromagnetic interference. This limits the use of SiC MOSFETs in power electronics applications.

The switching oscillation, or "ringing" phenomenon, has been observed in many studies on SiC MOSFET devices. The switching oscillation phenomenon is closely related to the fast switching characteristics of the power transistors.

Furthermore, the current trend to form the body wells close to each other under the gate terminal, caused by the corresponding reduction in the extension of the gate terminal, entails a reduction in the capacitive coupling (gate-drain capacitance $C_{gd}$, or feedback capacitance) between gate and underlying drain (for vertical conduction MOSFET devices). The reduction of the gate-drain capacitance $C_{gd}$ may be directly correlated to an increase in the amplitude of the oscillations of the drain voltage during the turn-OFF step of the MOSFET (recovery step, or recovery, of the body diode of the MOSFET). In fact, as known, the intrinsic body diode of a MOSFET has the same physical limitations as discrete diodes, including undesired behavior during the inverse recovery step. Inverse recovery occurs when the body diode turns off while still carrying a positive forward current.

Known solutions to reduce switching oscillations include, for example, the optimization of the PCB layout and the increase of the MOSFET gate resistance. A further approach provides for controlling the gate charge of the power MOS- FETs to suppress the turn-OFF oscillation. However, such approaches increase the complexity of manufacturing and of the device thus manufactured.

BRIEF SUMMARY

The present disclosure provides an electronic device that is free from the drawbacks of the prior art.

In various embodiments, an electronic device includes a semiconductor body having a first electrical conductivity and provided with a front side; an active area of the semiconductor body, accommodating source and gate regions of the electronic device and configured to accommodate, in use, a conductive channel of the electronic device; and an edge region of the electronic device, surrounding the active area. The edge region accommodates, at least in part, an edge termination region, having a second electrical conductivity opposite to the first electrical conductivity, extending into the semiconductor body at the front side; and a gate connection terminal of conductive material, electrically coupled to the gate region, extending on the front side partially superimposed on the edge termination region and capacitively coupled with a portion of the semiconductor body adjacent and external to the edge termination region.

BRIEF DESCRIPTION OF THE SEVERAL VIEWS OF THE DRAWINGS

For a better understanding of the present disclosure, embodiments thereof are now described, purely by way of non-limiting example, with reference to the attached drawings, wherein.

DETAILED DESCRIPTION

The present disclosure is illustrated with reference to the accompanying drawings which show a wafer, or a part of it, in a triaxial system of X, Y, Z axes orthogonal to each other.

Figure 1:
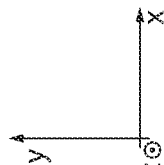
FIG. 1 illustrates a top view of a semiconductor die, accommodating an electronic device, in particular a MOSFET.
Figure 1:
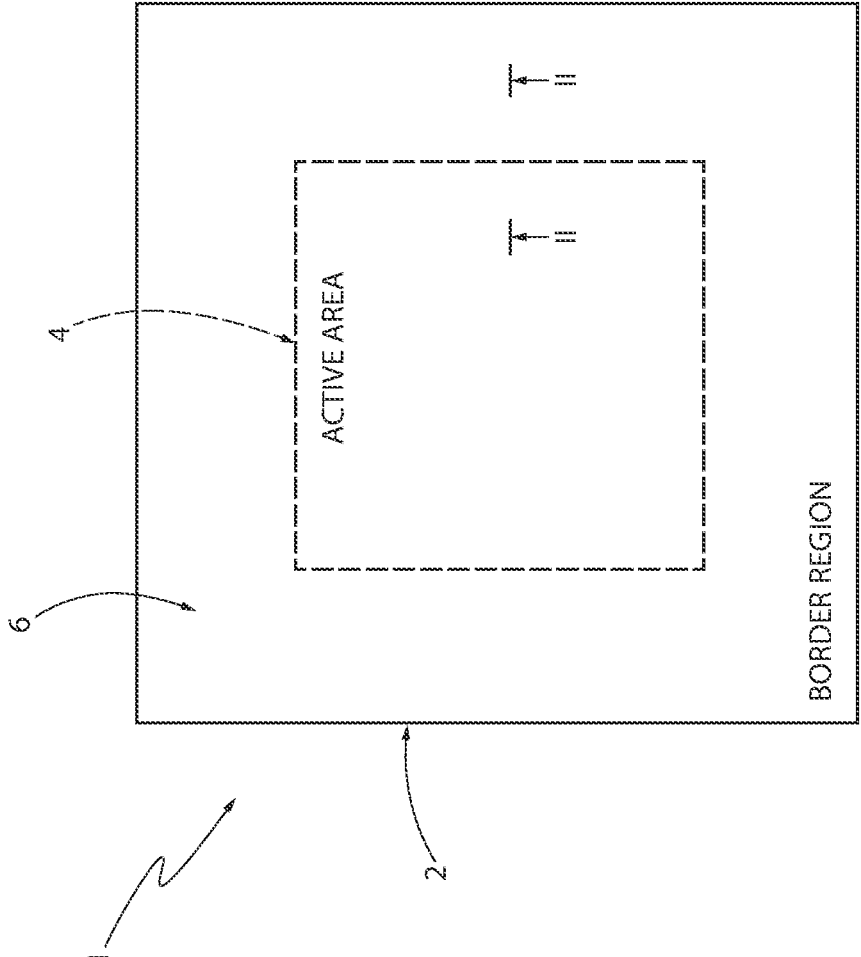

With reference to FIG. 1, a die or chip 1 is obtained after a dicing step of a semiconductor wafer. The die 1 is schematically illustrated in a top view, on the XY plane (this is the view at a front side 1a of the die 1). The die 1 comprises an external edge 2, which physically delimits the die 1. The die 1 accommodates at least one electronic device (not illustrated in FIG. 1), such as for example a MOSFET. Hereinafter, both the terms "electronic device" and "MOSFET" will be used, without thereby losing generality.

The die 1 includes at least two functional regions: an active area or region 4, typically extending into a central portion of the die 1, and an edge region 6, or peripheral or border region, which completely surrounds the active area 4. Stated differently, the edge region 6 encircles the active area 4. The edge region extends, in other words, between the active area 4 and the external edge 2.

The active area 4 is the portion of the die 1 that accommodates elements of the electronic device that participate in the on-state conduction or, in general, the region of the die 1 wherein the conductive channel is formed (in use). The active area 4 accommodates, for example, source regions, drain regions, and channel regions including the conductive channel of the MOSFET. The drain region extends, for example in case of a vertical conduction device, at a rear side 1b (not visible in FIG. 1 as it is parallel and opposite to the front side 1a) of the die 1. The conductive channel extends into a region of the active area 4 comprised between the front side 1a and the rear side 1b, that is between the source and the drain, in a mainly vertical direction (along Z) towards the rear side 1b.

The edge region 6, on the other hand, is a region which does not have the channel region, more specifically, in use, the conductive channel. Stated differently, the conductive channel is contained in the active area 4, and does not extend into the edge region 6. The edge region 6 may have functional elements for reducing or preventing crowding of the electric field outside the active area.

Figure 2:
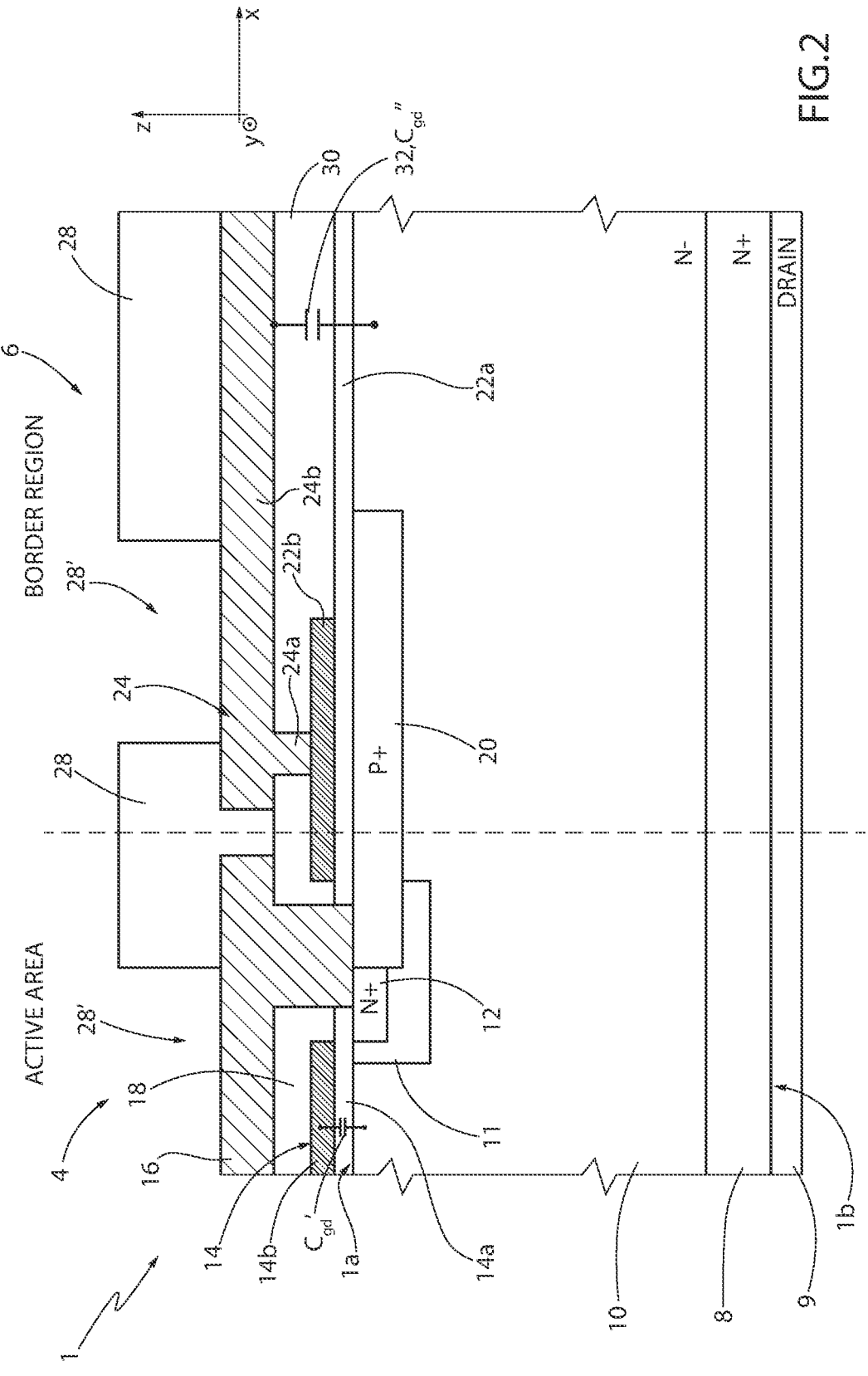
FIGS. 2-6 illustrate, in cross-sectional view, an electronic device, in particular a MOSFET, according to respective embodiments of the present disclosure.

FIG. 2 is a cross-sectional view (on the XZ plane) of a portion of the die 1, for example considered along scribe line II-II of FIG. 1. FIG. 2 illustrates portions of an electronic device, in particular a vertical conduction MOSFET, formed in the die 1.

With reference to FIG. 2, the die 1 includes: a semiconductor body, for example of Silicon Carbide (SiC) or Silicon (Si), having a first electrical conductivity (e.g., of N-type). The semiconductor body comprises a substrate 8 (N+ doped) and a drift layer 10 (N− doped) on the substrate 8. A drain terminal 9, for example of metal material, extends on the rear side 1b of the semiconductor body.

Body regions 11, having a second electrical conductivity (P) of type opposite to the first conductivity, and source regions 12, having the first conductivity (and N+ doping) in the body regions 11 are present at the front side 1a of the drift layer 10. The body regions 11 and the source regions 12 are regions implanted in the drift layer 10, in a per se known manner.

Gate regions 14 extend above the front side 1a, and include a gate dielectric 14a and a gate conductive region 14b. The gate dielectric is interposed between the gate conductive region 14b and the semiconductor body (in particular the drift layer 10).

FIG. 2 illustrates, for simplicity of representation, a single body region 11 accommodating a respective source region 12, whereon a respective gate region 14 extends. In particular, these illustrated body 11, source 12 and gate 14 regions extend in proximity of the end of the active area 4, after which the edge region 6 begins, as previously described.

The electronic device further comprises a source (e.g., metal) terminal 16, which extends in contact with the front side 1a at the source region 12, and is isolated from the gate region 14 by an insulating layer 18. As shown in FIG. 2, the source terminal 16 is on the source region 12 and an edge termination region 20.

The die 1 further accommodates, inside the semiconductor body (in particular in the drift layer 10), an edge termination region 20, implanted at the front side 1a and facing the front side 1a. The edge termination region 20 has the second electrical conductivity and a doping (P+) greater than that of the body region 11. The edge termination region 20 extends from the active area 4 in electrical contact with the source 12 and body 11 regions and proceeds along the X axis inside the edge region 6. The edge termination region 20 has the function of preventing or inhibiting the generation, in the dielectric layer 22a present under the region 22b, of an electric field having a value such that it damages the dielectric layer 22a.

A dielectric layer 22a (similar to the gate dielectric 14a) and a conductive layer 22b on the dielectric layer 22a (similar to the gate conductive region 14b) extend above the edge termination region 20 (on the front side 1a). However, the layers 22a and 22b do not have, in use, the function of gate terminal (i.e., they do not contribute to the formation of a conductive channel).

The electronic device further comprises a gate connection terminal 24, of conductive material, for example metal or N-type doped polysilicon, including a first portion 24a which extends in electrical contact with the conductive layer 22b and a second portion 24b which extends above and at a distance from the conductive layer 22b, in the edge region 6. The first and the second portions 24a, 24b are a single piece (monolithic) in structural and electrical continuity with each other. The second portion 24b forms an edge field plate, also said gate shield of the electronic device.

Furthermore, the gate connection terminal 24 is (in a manner not illustrated in Figure) in electrical contact with the gate region 14. The gate connection terminal 24 also has a region for electrical contact (e.g., by wire bonding or other technique) to provide the electronic device with gate bias during use.

The dashed line in FIG. 2, which discriminates between the active area 4 and the edge region 6, is to be understood as qualitative. For the purposes of the description of the present disclosure, the second portion 24b of the gate connection terminal 24 is completely accommodated in the edge region 6 and therefore is located in the right-hand portion with respect to the dashed demarcation line between the active area 4 and the edge region 6.

A passivation layer 28 extends on the gate connection terminal 24 and on the source terminal 16, to protect and insulate the gate connection terminal 24 and the source terminal 16. Openings 28' are provided in the passivation layer 28 for being able to electrically contact the gate connection terminal 24 and the source terminal 16 (as said, e.g. by wire bonding, to provide the respective biases during use).

The second portion 24b of the gate connection terminal 24 extends at a distance from the front side 1a, and in particular is separated from the front side 1a of the semiconductor body (in particular, from the drift layer 10) by a dielectric or insulating layer 30. The dielectric layer 30 also extends between the conductive layer 22b and the gate connection terminal 24; the physical contact between the first portion 24a of the gate connection terminal 24 and the conductive layer 22b occurs by a conductive through-via that extends through the entire thickness (along Z) of the dielectric layer 30.

The maximum extension along the Z axis (thickness) of the stack formed by the dielectric layer 30 and the underlying dielectric layer 22a is indicated hereinafter as $\text{Th}_{diel}$ and has a value, for example, comprised between 0.8 and 2.4 In other words, $\text{Th}_{diel}$ represents the total thickness of the dielectric layer 22a plus the dielectric layer 30 between the second portion 24b of the gate connection terminal 24 and the front side 1a.

According to an embodiment of the present disclosure, the dielectric layer 22a and the dielectric layer 30 are of the same material.

According to a further embodiment of the present disclosure, the dielectric layer 22a extends exclusively below the conductive layer 22b, and is not present below the dielectric layer 30; in this case, the dielectric layer 30 extends between the front side 1a and the second portion 24b of the gate connection terminal 24 and therefore $Th_{diel}$ represents the maximum thickness of the dielectric layer 30 between the second portion 24b of the gate connection terminal 24 and the front side 1a.

According to an aspect of the present disclosure, the extension along the X axis of the gate connection terminal 24 (in particular, of the second portion 24b) is greater than the extension, again along X, of the edge termination region 20. In other words, in the sectional view of FIG. 2 or in the top view of FIG. 7, the gate connection terminal 24 is in part superimposed on the edge termination region 20 and in part extends beyond the edge termination region 20, in such a way that it faces the semiconductor body (in particular the drift layer 10) through the dielectric layer 30 and, if present, the insulating layer 22a, in correspondence of an N-type doped portion of the front side 1a of the semiconductor body, that is wherein the edge termination region 20 does not extend (is not present).

The extension along X (similarly, as may be seen from FIG. 7, also along Y) of the portion of the gate connection terminal 24 which faces the respective N-type doped portion of the front side 1a is indicated hereinafter as $L_{shield}$.

It is noted that the N-type doped portion of the front side 1a where the gate connection terminal 24 faces, is in electrical connection with the drain region 9 of the electronic device. A capacitive coupling is thus provided (schematically illustrated with the symbol of a capacitor 32 in FIG. 2) between the gate connection terminal 24 (first plate of the capacitor 32) and the drain region 9 (second plate of the capacitor 32), wherein the dielectric layer 30 and, if any, the insulating layer 22a form the dielectric interposed between the two plates of the capacitor 32. Since the gate connection terminal 24 (first plate of the capacitor 32) is in electrical connection with the gate terminal 14 of the MOSFET and the second plate of the capacitor 32 coincides, from an electrical point of view, with the drain region 9 of the MOSFET, the capacitive coupling occurs between the gate terminal 14 and the drain terminal 9 of the MOSFET.

In this manner, the total gate-drain capacitance $C_{gd}$ of the electronic device (the MOSFET) is given by the sum of two capacitive contributions: a first contribution $C_{gd}{'}$ is given by the capacitance between gate and drain present in active area 4, at the overlap region between gate terminal 14 and N-doped drift layer 10; a second contribution $C_{gd}{''}$ is given by the capacitance value symbolically identified by the capacitor 32.

The capacitance $C_{gd}$ is a non-linear function of the voltage and is a relevant parameter as it provides a feedback loop between the output and the input of the circuit. The capacitance $C_{gd}$ is also known as Miller capacitance as it makes the total dynamic input capacitance greater than the sum of the static capacitances. The turn-OFF delay of the MOSFET device is due to the time to discharge the input capacitance after removing the bias. Since the input capacitance is a function of the capacitance $C_{gd}$, the increase in the capacitance $C_{gd}$ (by the contribution $C_{gd}{''}$ added according to the present disclosure) entails a corresponding adjustment of the turn-OFF delay, and allows to balance the undesired behavior during the inverse recovery step of the body diode of the MOSFET, damping the recovery current oscillations. The capacitance $C_{gd}$ thus set or designed is such that it varies the response of the electronic device accordingly with respect to the switching oscillations during the turn-OFF step. In particular, an increase in the feedback capacitance corresponds to a damping of the switching oscillations during the turn-OFF step.

By suitably defining, during the design step, the extension (area) of capacitive coupling between the gate connection terminal 24 and the drift layer 10, a predefined and/or desired value of capacitance $C_{gd}$ may be generated. The effect discussed above is observed for any value of capacitance 32 introduced according to the present disclosure; however, the Applicant has verified that the values of the capacitance $C_{gd}{''}$ of tens of picofarads, for example in the range 65-130 pF for values of drain-source voltage (Vds) equal to or higher than 100 V, are a suitable solution. The capacitance $C_{gd}{''}$ is added, as said, to the capacitance $C_{gd}{'}$ still present in active area 4 and typically with a value lower than 25 pF for values of drain-source voltage (Vds) equal to or higher than 100 V.

Therefore, the following relationship (1) applies:

$$\frac{\left(1.15 \cdot 10^5/m\right)^* Th_{diel} * w_{AA}}{\varepsilon_{diel}} \leq L_{shield} \leq \frac{\left(2.3 \cdot 10^5/m\right)^* Th_{diel} * w_{AA}}{\varepsilon_{diel}} \quad (1)$$

Similarly, by making the constant $\varepsilon_0$ explicit, the relationship (1) may be expressed as:

$$\frac{\left(1 \cdot 10^{-6*} F/m^2\right)^* Th_{diel} * w_{AA}}{\varepsilon_{diel}\varepsilon_0} \leq L_{shield} \leq \frac{\left(2 \cdot 10^{6*} F/m^2\right)^* Th_{diel} * w_{AA}}{\varepsilon_{diel}\varepsilon_0} \quad (2)$$

The constant $\varepsilon_{diel}$ is the dielectric constant of the material used for the dielectric layer 30 and, if any, for the dielectric layer 22a (assumed to be of the same material); the constant $\varepsilon_0$ is the dielectric constant of vacuum; $W_{AA}$ is the length, in XY plane view of FIG. 1 or FIG. 7, of a side along X or Y of the active area 4 (assumed to have a square shape); "F" indicates the unit of measurement "Farad"; and "m" the unit of measurement "meter."

Relationships (1) and (2) set forth above for $L_{shield}$ are also based on the following assumptions:

i) that the die 1 has a substantially square shape (possibly with rounded corners), with a side $W_{die}$ (e.g., $W_{die}$ equal to about 2000-8000 μm, for example 4000 μm);

ii) that the active area 4 has a substantially square shape (possibly with rounded edges), with a side $W_{AA}$ e.g. equal to about ¾ $W_{die}$; and iii) that, in the active area, the value of capacity $C_{gd}{'}$ is lower than or equal to 1.5 pF/mm$^2$ for Vds≥100V.

Alternatively to what has been set forth above, the relationships (1) and (2) may be replaced by equivalent relationships (3) and respectively (4) illustrated hereinbelow, wherein the parameter $L_{shield}$ is replaced by the value of area $S_{shield}$ (in XY plane view) of the portion of the gate connection terminal 24 which contributes to the capacitance $C_{gd}{''}$:

$$\frac{\left(4.6 \cdot 10^5/m\right) \cdot Th_{diel} \cdot w_{AA}^2}{\varepsilon_{diel}} \leq S_{shield} \leq \frac{\left(9.2 \cdot 10^5/m\right) \cdot Th_{diel} \cdot w_{AA}^2}{\varepsilon_{diel}} \quad (3)$$

Similarly, by making the constant $\varepsilon_0$ explicit, the relationship (3) may be expressed as:

$$\frac{\left(4 \cdot 10^{-6} \cdot F/m^2\right) \cdot Th_{diel} \cdot w_{AA}^2}{\varepsilon_{diel}\varepsilon_0} \le S_{shield} \le \frac{\left(8 \cdot 10^{-6} \cdot F/m^2\right) \cdot Th_{diel} \cdot w_{AA}^2}{\varepsilon_{diel}\varepsilon_0} \quad (4)$$

Relationships (3) and (4) are approximate, as the area contributions at the edges are not considered, such contributions representing at most a value between 5% and 6% of the total area $S_{shield}$, given that $L_{shield} \ll W_{AA}$.

According to an aspect of the present disclosure, the capacitance contribution $C_{gd}''$ is chosen in such a way that the total capacitance $C_{gd}$ (i.e., given by $C_{gd}' + C_{gd}''$) is such that it triggers, during the turn-OFF of the MOSFET device, the per se known parasitic turn-ON (PTO) phenomenon. When the PTO phenomenon occurs, the MOSFET turns on unintentionally, causing a temporary (parasitic) current flow in the active area. The presence of this parasitic current mitigates the effect of undesired oscillations during the turn-OFF step, more particularly it reduces the total amplitude of the oscillation of the drain-source voltage by several percentage points (for example, for current pulses of 2 A/ns, there is observed a reduction of the drain bus supply voltage below 15%).

According to an embodiment, the insulating layer 22a may be omitted in the capacitive coupling region, so that the dielectric interposed between the two plates of the capacitor is formed exclusively by the dielectric layer 30. The dielectric material of the layer 30 may thus be suitably selected as needed, regardless of the material chosen for the insulating layer 22a.

The dielectric layer 30 (similarly, also the insulating layer 22a) may be one of: Silicon Oxide ($SiO_2$), Silicon Nitride (SiN, $Si_3N_4$), Silicon Oxynitride ($SiO_xN_y$), or a high-k dielectric material, with k>7. Usable high-k materials include, for example, Aluminum Nitride (AlN), Aluminum Oxynitride (ALON, $Al_2O_3$), Tantalum Oxide (TaO, $Ta_2O_5$), Hafnium Oxide ($HfO_2$), Zirconium Oxide ($ZrO_2$), etc.

Figure 3:
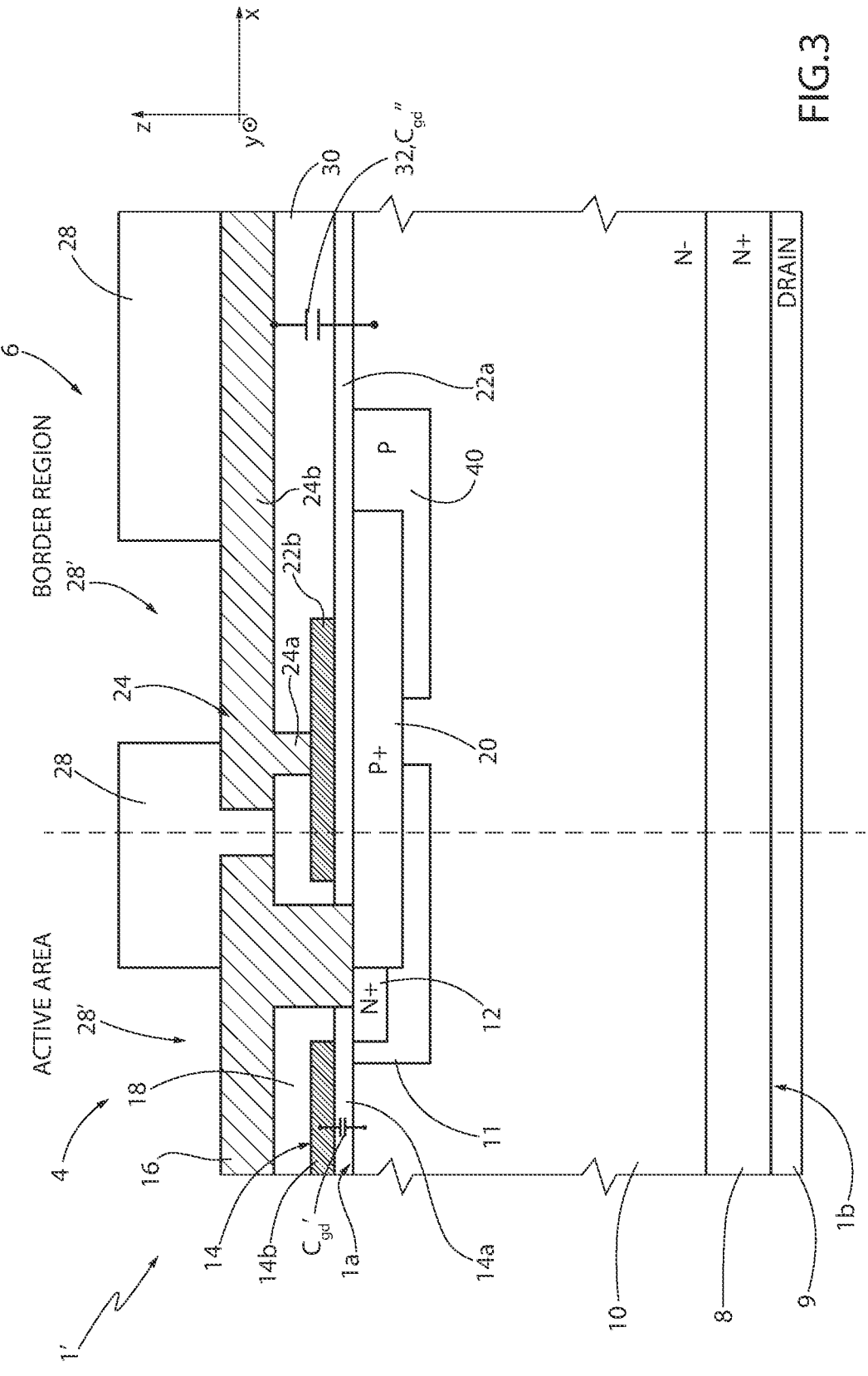

FIG. 3 illustrates a further embodiment of the present disclosure. Elements of FIG. 3 common to FIG. 2 are indicated with the same reference numbers and are not further described.

The die 1' of FIG. 3 comprises, in addition to what has already been described with reference to FIG. 2, a further implanted region 40 having the second electrical conductivity (of P-type) and doping lower than the doping of the edge termination region 20. The implanted region 40 extends at an end portion of the edge termination region 20, at a distance from the body region 11. Stated differently, the body region 11 and the implanted region 40 are positioned at opposite ends of the edge termination region 20. The implanted region 40 therefore extends as an extension of the edge termination region 20. The implanted region 40 has the function of distributing or thinning the field lines of the electric potential in such a way that it avoids a thickening of the field lines on the radius of curvature of the edge termination region 20, and thus maximizes the edge breakdown voltage value.

According to this embodiment, the extension along the X axis of the gate connection terminal 24 (in particular, of the second portion 24b) is greater than the maximum height reached, along the X axis, by the implanted region 40 (which, as said, extends as an extension of the edge termination region 20). In other words, in the sectional view of FIG. 3 (or in a corresponding top view as in FIG. 1), the gate connection terminal 24 is completely superimposed on the edge termination region 20 and also extends beyond the implanted region 40. In this manner the gate connection terminal 24 faces the semiconductor body (in particular the drift layer 10) through the dielectric layer 30 (and the insulating layer 22a if any), without the implanted region 40 being present therebetween. A capacitive coupling similar to that described with reference to FIG. 2 (illustrated with the symbol of the capacitor 32) is thus provided between the gate connection terminal 24 and the N-type semiconductor body.

Figure 4:
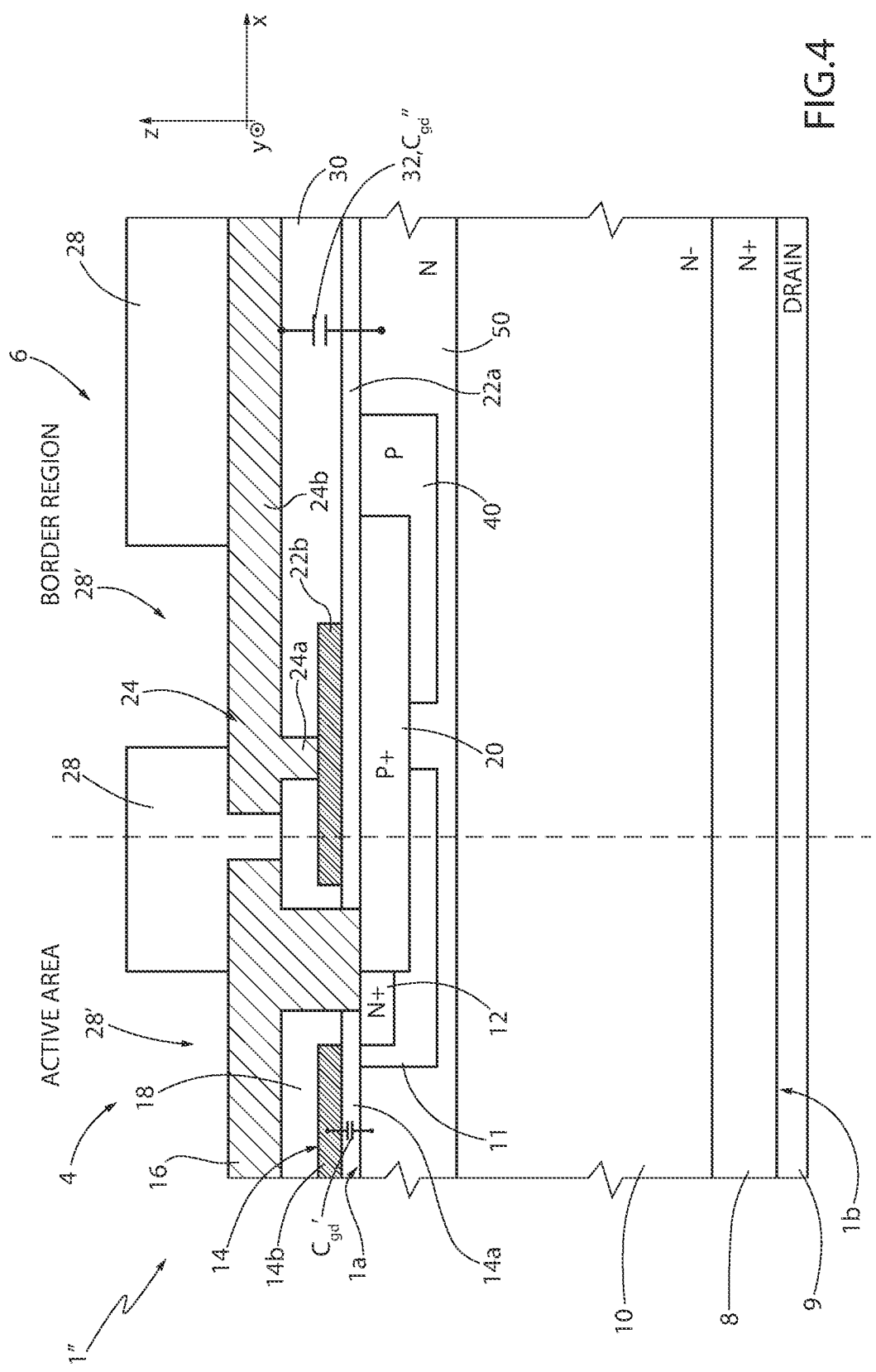

FIG. 4 illustrates a further embodiment of the present disclosure. Elements of FIG. 4 common to FIG. 2 and FIG. 3 are indicated with the same reference numbers and are not further described.

The die 1'' of FIG. 4 comprises, in addition to what has already been described with reference to FIG. 2 and FIG. 3, a current spread layer (CSL) 50, which extends into the semiconductor body (in particular into the drift layer 10) facing the front side 1a. The current spread layer 50 is provided by one or more implants of doping species having the first conductivity and forms an enrichment layer which extends in depth from the front side 1a. Alternatively, the current spread layer 50 is obtained by epitaxial growth. The current spread layer 50 may also be formed by combining an epitaxial growth step and subsequent implant (for example in active area 4).

In one embodiment, the depth whereto the current spread layer 50 extends is greater than the maximum depth reached by the body region 11, the implanted region 40 and the edge termination region 20. In other words, in this embodiment, all of the body region 11, the implanted region 40 and the edge termination region 20 are completely contained within the current spread layer 50.

In a further embodiment, the current spread layer 50 extends (at least, or exclusively, in the edge region 6) to a lower depth than the maximum depth reached by the body region 11, the implanted region 40 and the edge termination region 20.

Regardless of the embodiment, the doping of the current spread layer 50 is greater than the doping of the drift layer 10 accommodating it. The current spread layer 50 has, for example, doping of the order of $5 \cdot 10^{16}$ to $2 \cdot 10^{17}$ atoms/cm³.

The current spread layer 50 extends through the entire extension of the surface 1a, or for a part of it. Regardless of the layout chosen for the current spread layer 50, in the context of the present disclosure it extends at least in part superimposed (in top view) on the gate connection terminal 24. In this manner, the gate connection terminal 24 in part faces the current spread layer 50 through the dielectric layer 30 (and the insulating layer 22a if any) without the implanted region 40 or the edge termination region 20 being present therebetween. A capacitive coupling, similar to that described with reference to FIG. 2 or FIG. 3 (illustrated with the symbol of the capacitor 32) is thus provided between the gate connection terminal 24 and the current spread layer 50 in the semiconductor body.

The use of the current spread layer 50 is known per se and is widely used in MOSFETs for high frequency applications, with advantages and function that are known and not discussed herein. In the context of the present disclosure, the presence of the current spread layer 50 has the further advantage of improving, in use, the capacitive coupling between the gate connection terminal 24 and the semiconductor body (in particular, between the gate connection terminal 24 and the drain terminal).

Figure 5:
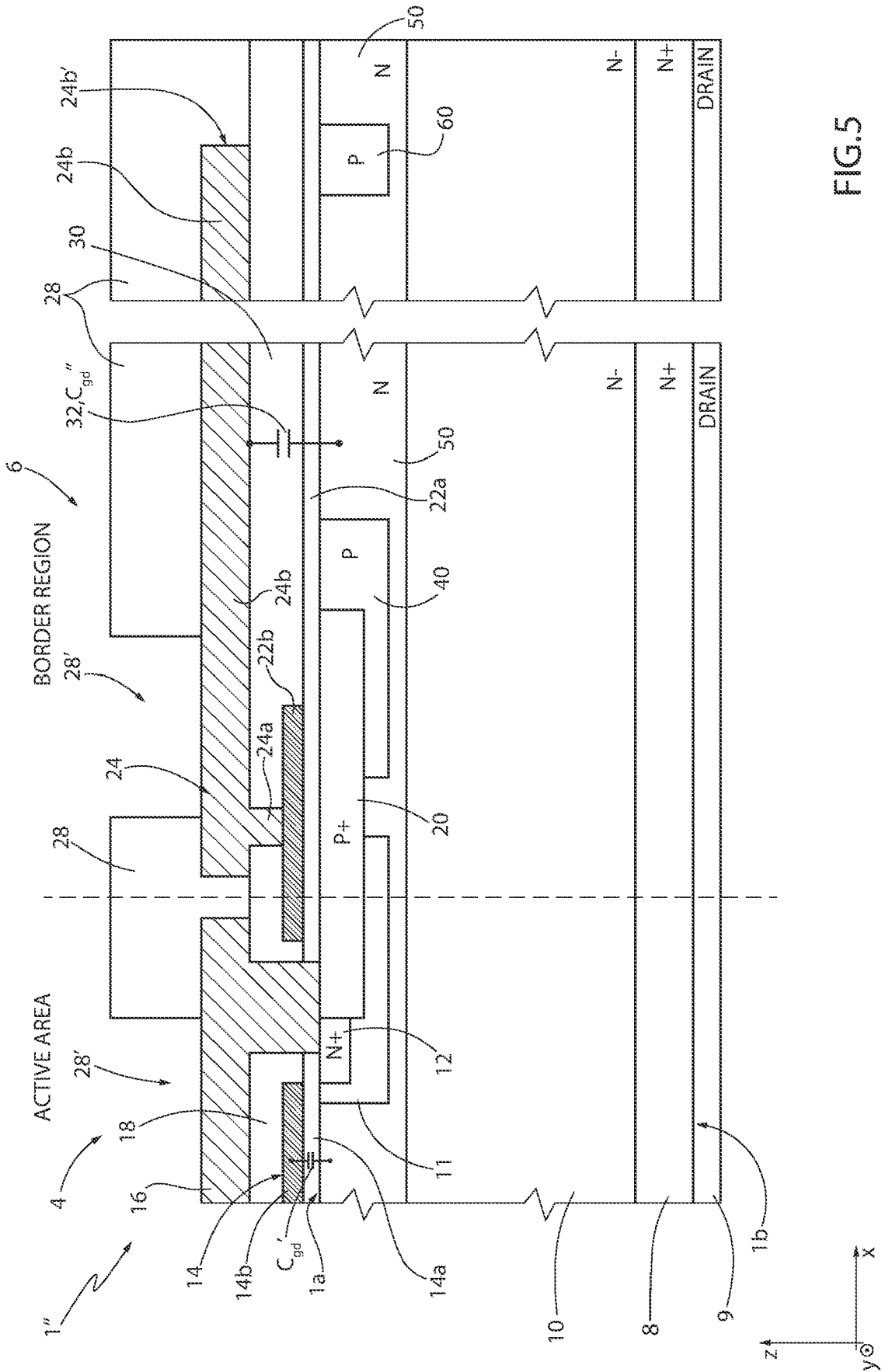

FIG. 5 illustrates a view of the die 1'' (similarly, of the die 1 and 1', with the respective elements further present or missing with respect to die 1'') wherein an expanded portion of the edge region 6 is shown. In particular, the view of FIG.

5 shows the presence of a further implanted region 60 in the semiconductor body (in particular in the drift layer 10) facing the front side 1a. The implanted region 60 has the second electrical conductivity (P-type, e.g. of the order of $5 \cdot 10^{16}$-$2 \cdot 10^{17}$ ions/cm$^3$) and, for example, is formed in the same step of forming the implanted region 40. The implanted region 60 extends at a distance from the implanted region 40 and, in top view (on the XY plane) is at least in part aligned (along the Z axis direction) with a final part 24b' of the gate connection terminal 24, in particular with a final part 24b' of the second portion 24b of the gate connection terminal 24. The presence of the implanted region 60 does not affect the feedback capacitance previously described and represented by the capacitor 32, since this capacitive coupling is in any case provided between the gate connection terminal 24 and the semiconductor body in the region comprised between the implanted region 40 and the implanted region 60. The implanted region 60 has the function of distributing or thinning the field lines of the electrical potential in such a way as that it avoids a thickening of the field lines on the bottom corner of the final part 24b' of the second portion 24b, thus obviating the risk of making the electric field critical at the final part 24b'.

In the embodiment of FIG. 5, the length $L_{shield}$ is the distance (along X and along Y) comprised between the implanted region 40 and the implanted region 60.

Figure 6:
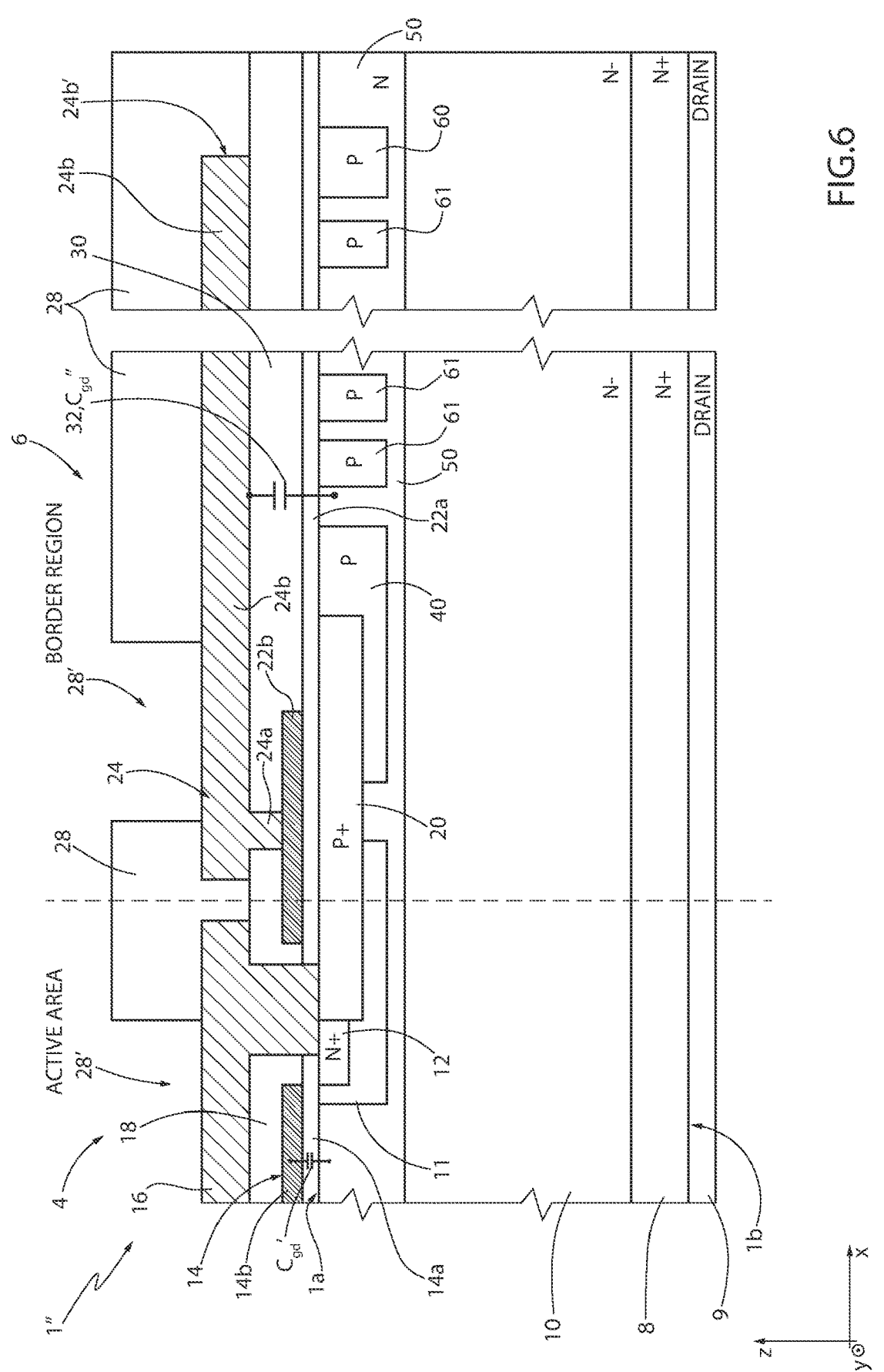

FIG. 6 illustrates a further embodiment of the present disclosure wherein one or more floating regions 61 of P-type, provided by implanting doping species at the front side 1a, are present between the implanted region 40 and the implanted region 60. The floating regions 61 extend at a distance from each other (i.e., an N-type portion of the semiconductor body—in particular of the drift layer 10—is present between a floating region 61 and the subsequent along the X axis direction). A similar layout may be observed along the Y direction.

In the embodiment of FIG. 6, the length $L_{shield}$ is the sum of the distances (along X and, similarly, along Y) between a floating region 61 and the subsequent floating region 61 (as well as the distance between the implanted region 40 and the floating region 61 immediately following, and between the implanted region 60 and the floating region 61 immediately preceding).

The embodiment of FIG. 6, relating to the presence of the floating regions 61, can be applied in a per se evident manner also to the embodiments of FIGS. 2 to 4.

Figure 7:
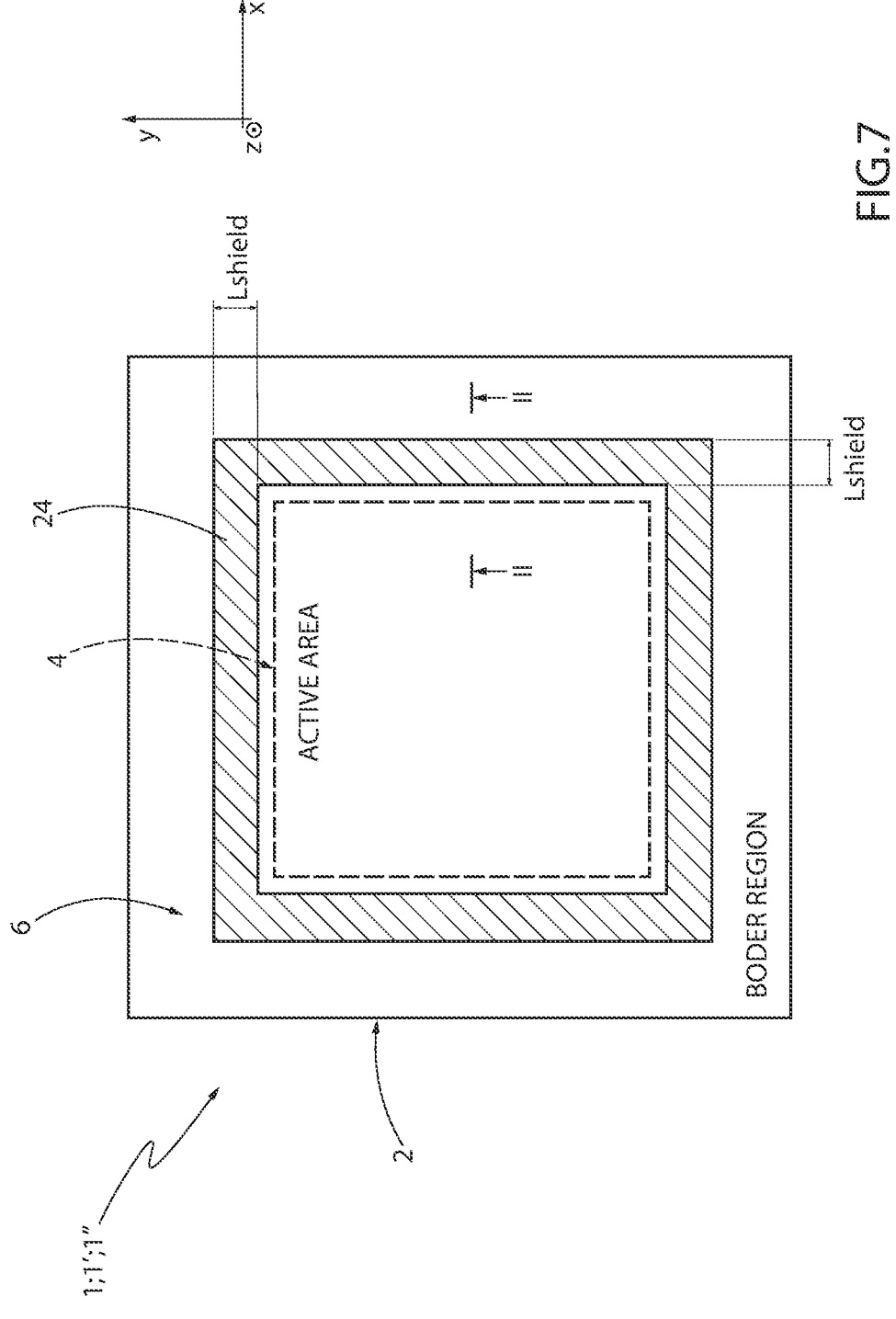
FIG. 7 illustrates, in top view, the semiconductor die of FIG. 1 wherein a gate connection terminal is present in the edge region, according to an aspect of the present disclosure.

FIG. 7 illustrates, in top view (on the XY plane) the die 1 of FIG. 1 wherein the extension of the gate connection terminal 24 is also schematically represented. As it is observed, the gate connection terminal 24 has, in this example, the shape of a ring and completely surrounds the active area 4. However, embodiments may be provided wherein the gate connection terminal 24 partially surrounds the active area 4, based on specific layout and design needs.

The advantages of the proposed solution are evident from what has been previously described.

In particular, according to the present technical solution, the capacitance $C_{gd}$ is a device-integrated distributed capacitance.

The capacitance $C_{gd}$ between the gate and drain terminals (feedback capacitance) is increased by a factor defined by the capacitive coupling between the gate connection terminal 24 and the underlying N-type doped region of the semiconductor body. In this manner, the increase of the feedback capacitance allows to dampen the amplitude of the oscillations of the drain voltage during the turn-OFF step of the MOSFET (recovery step, or recovery, of the body diode of the MOSFET).

Finally, it is clear that modifications and variations may be made to what has been described and illustrated herein without thereby departing from the scope of the present disclosure.

For example, in a further embodiment of the present disclosure illustrated in FIG. 8, a capacitive decoupling layer 70 of P-type is present, at the front side 1a, extending seamlessly below the gate connection terminal 24 or, in other words, interposed between the gate connection terminal 24 and the underlying N-type doped region of the semiconductor body. This capacitive decoupling layer 70 has for example a thickness comprised between 0.2-0.4 µm and exemplarily a doping of the order of $10^{16}$ ions/cm$^3$. In general, the capacitive decoupling layer 70 is designed in such a way that, when the device is in the on-state (for example for values of drain-source voltage Vds higher than 5 V or 10 V) the holes are depleted in the capacitive decoupling layer 70, and the capacitive decoupling layer 70 allows the capacitive coupling between the gate connection terminal 24 and the underlying N-type doped region of the semiconductor body, forming the capacitor 32 as previously described.

Figure 8:
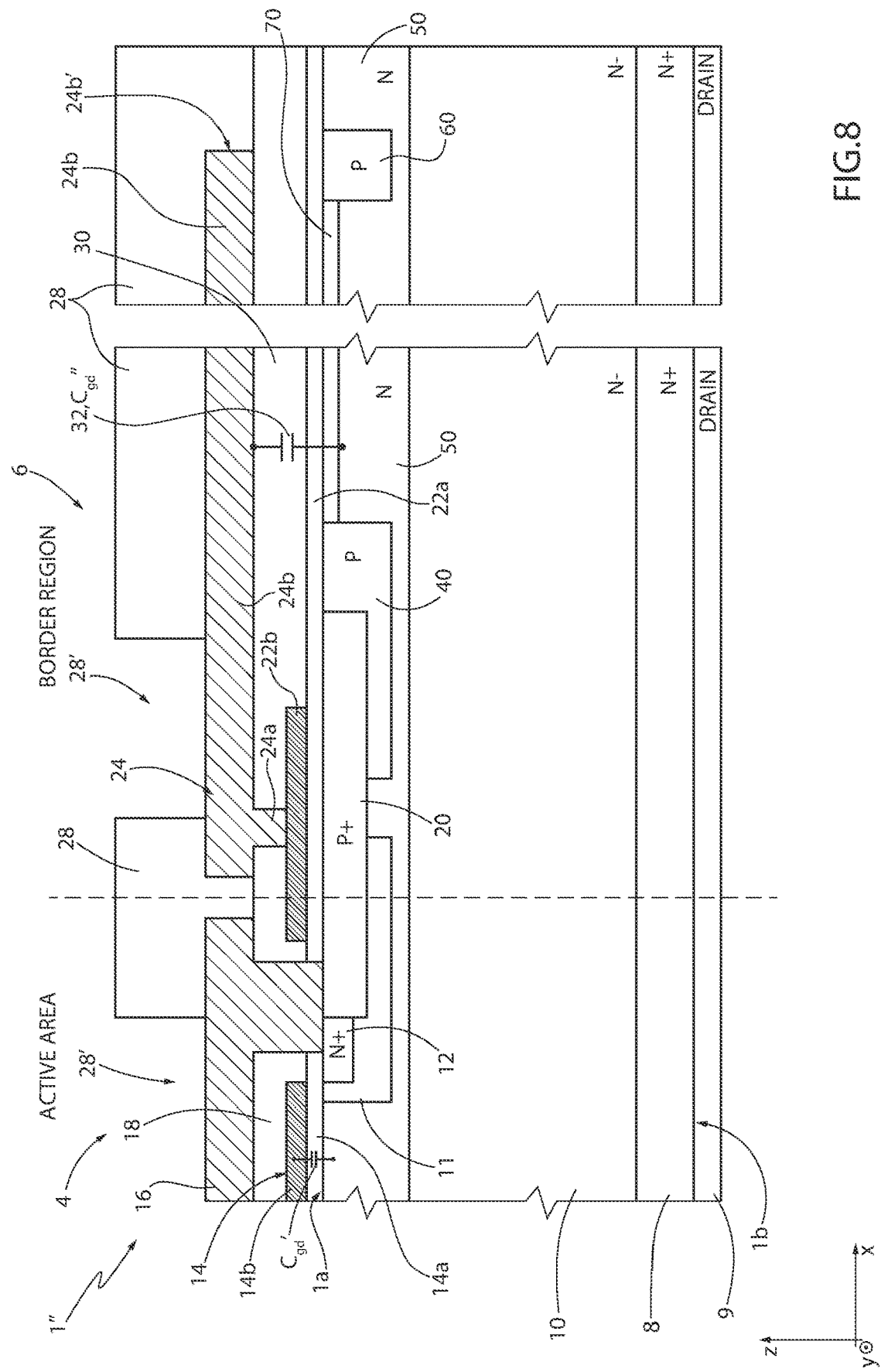
FIG. 8 illustrates, in cross-sectional view, an electronic device, in particular a MOSFET, according to a further embodiment of the present disclosure.

While the embodiment of FIG. 8 is based on FIG. 5, this embodiment (presence of the layer 70) applies similarly to the embodiments of FIGS. 2-4.

For example, while the present disclosure has been described with explicit reference to an N-channel device, the proposed technical solution applies, in a similar manner, to P-channel devices.

An electronic device may be summarized as including a semiconductor body (8, 10) having a first electrical conductivity (N) and provided with a front side (1a); an active area (4) of the semiconductor body, accommodating the source (12) and gate (14) regions of the electronic device and configured to accommodate, in use, a conductive channel of the electronic device; an edge region (6) of the electronic device, surrounding the active area (4) and accommodating at least in part: an edge termination region (20), having a second electrical conductivity (P) opposite to the first electrical conductivity (N), extending into the semiconductor body at the front side (1a); and a gate connection terminal (24) of conductive material, electrically coupled to the gate region (14), extending on the front side (1a) partially superimposed on the edge termination region (20), configured to establish, in use, a capacitive coupling (32, $C_{gd}$") with a portion of the semiconductor body having the first electrical conductivity (N), adjacent and external to the edge termination region (20).

The edge termination region (20) may be in electrical contact with the source region (12).

The active area (4) may further include a body region (11) having the second electrical conductivity (P), said source region extending inside the body region, and the edge termination region (20) may also be in electrical contact with the body region and has a doping dose greater than the respective doping dose of the body region.

The electronic device may further include a dielectric layer (30; 30, 22a) interposed between the front side (1a) and the gate connection terminal (24).

The gate connection terminal (24) may form a first plate of a capacitor (32), the semiconductor body may form a second plate of the capacitor (32), and the dielectric layer (30; 30, 22a) may be interposed between the first and the second plates of the capacitor (32).

The dielectric layer (30; 30, 22*a*) may be of Silicon Oxide, or Silicon Nitride, or Silicon Oxynitride.

The dielectric layer (30; 30, 22*a*) may be of a high-k material, in particular having a value of the parameter k higher than 7.

The electronic device may further include a first protection ring (40) having the second electrical conductivity (P) and a doping value lower than a doping value of the edge termination region (20), extending into the semiconductor body at a final portion of the edge termination region (20).

The electronic device may further include a second protection ring (60) having the second electrical conductivity (P) and a doping value lower than a doping value of the edge termination region (20), extending into the semiconductor body at a final portion (24*b'*) of the gate connection terminal (24).

The electronic device may further include one or more floating regions (61) having the second electrical conductivity (P), extending into the semiconductor body between the first protection ring (40) and the second protection ring (60).

The edge region (6) may further include a current spread layer, CSL, (50) extending into the semiconductor body (8, 10) at the front side (1*a*), wherein the CSL (50) may have the first electrical conductivity (N) and doping value higher than a doping value of the portion of the semiconductor body (8, 10) wherein it is contained.

The electronic device may further include a drain region (9) extending at a rear side (1*b*), opposite to the front side (1*a*), of the semiconductor body (8, 10).

The portion of the semiconductor body having the first electrical conductivity (N) adjacent and external to the edge termination region (20) may also be in electrical contact with the drain region (9).

The gate region (14) may define, with portions of the semiconductor body (8, 10) extending below the gate region (14) and having the first electrical conductivity (N), a first contribution ($C_{gd}'$) of capacitance ($C_{gd}$) between the gate region and the drain region of the electronic device.

The capacitive coupling (32, $C_{gd}''$) may define a second contribution ($C_{gd}''$) of the capacitance ($C_{gd}$) between the gate region and the drain region which is added to said first contribution ($C_{gd}'$).

The second contribution ($C_{gd}''$) may be designed with a value such that it triggers a parasitic turn-ON, PTO, phenomenon, during a turn-OFF of the electronic device.

The overlap of the edge termination region (20) with the portion of the semiconductor body having the first electrical conductivity (N) adjacent and external to the edge termination region (20), may have a value $L_{shield}$ along a reference axis (X; Y) parallel to the front side (1*a*), which meets the relationship:

$$\frac{\left(1.15 \cdot 10^5/m\right)^* Th_{diel}* w_{AA}}{\varepsilon_{diel}} \le L_{shield} \le \frac{\left\{2.3 \cdot 10^5/m\right\}^* Th_{diel}^* w_{AA}}{\varepsilon_{diel}}$$

or, equivalently:

$$\frac{\left(1 \cdot 10^{-6*} F/m^2\right)^* Th_{diel}* w_{AA}}{\varepsilon_{diel}\varepsilon_0} \le L_{shield} \le \frac{\left(2 \cdot 10^{-6*} F/m^2\right)^* Th_{diel}* w_{AA}}{\varepsilon_{diel}\varepsilon_0}$$

where:

$W_{AA}$ is the maximum extension, along said reference axis (X; Y), of the active area (4), the active area (4) having a square shape;

$\varepsilon_{diel}$ is the dielectric constant of the material of the dielectric layer (30; 30, 22*a*); and $\varepsilon_0$ is the dielectric constant of vacuum.

The edge region (6) may further accommodate a capacitive decoupling layer (70) extending into the semiconductor body (8, 10) at the front side (1*a*) laterally to the edge termination region (20) and interposed between the gate connection terminal (24) and the portion of the semiconductor body having the first electrical conductivity (N) adjacent and external to the edge termination region (20), wherein the capacitive decoupling layer (70) is configured to deplete majority carriers having the second electrical conductivity (P) when the electronic device is in use, thus allowing the establishment of said capacitive coupling.

The capacitive decoupling layer (70) may have a doping dose of the order of $10^{16}$ ions/cm$^3$, and extends into the semiconductor body with a thickness between 0.2 and 0.4 μm.

The electronic device may be a vertical conduction MOSFET.

The semiconductor body may be of Silicon Carbide.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electronic device comprising:

a semiconductor body having a first electrical conductivity and a front side;

an active area of the semiconductor body, the active area including a source region, a source terminal electrically coupled to the source region, a gate region, and, in use, a conductive channel;

an edge region of the electronic device, the edge region surrounding the active area, the edge region including, at least in part:

an edge termination region having a second electrical conductivity opposite to the first electrical conductivity, the edge termination region extending into the semiconductor body at the front side;

a conductive layer on the edge termination region;

a gate connection terminal including conductive material and electrically coupled to the gate region and the conductive layer, the gate connection terminal extending on the front side and partially superimposed on the edge termination region, the gate connection terminal configured to establish, in use, a capacitive coupling with a portion of the semiconductor body adjacent and external to the edge termination region;

a first dielectric layer extending in the active area and the edge region and on the front side, the conductive layer being spaced from the edge termination region by the first dielectric layer; and a second dielectric layer extending in the active area and the edge region and on the conducive layer and the first dielectric layer, the gate connection terminal including a first portion on the second dielectric layer and a second portion extending through the second dielectric layer to the conductive layer, the source terminal including a first portion on the second dielectric layer and a second portion extending through the first and second dielectric layers to the source region.

2. The electronic device according to claim 1, wherein the edge termination region is in electrical contact with the source region.

3. The electronic device according to claim 1, wherein the active area includes a body region having the second electrical conductivity, the source region extending inside the body region, and wherein the edge termination region is in electrical contact with the body region and has a doping dose greater than a doping dose of the body region.

4. The electronic device according to claim 1, wherein the gate connection terminal is a first plate of a capacitor, the semiconductor body is a second plate of the capacitor, and the second dielectric layer is interposed between the first and the second plates of the capacitor.

5. The electronic device according to claim 1, wherein the second dielectric layer includes Silicon Oxide, Silicon Nitride, or Silicon Oxynitride.

6. The electronic device according to claim 1, wherein the second dielectric layer includes a high-k material having a value of a parameter k higher than 7.

7. The electronic device according to claim 1, further comprising:

a first protection ring having the second electrical conductivity and a doping value lower than a doping value of the edge termination region, the first protection ring extending into the semiconductor body at an end portion of the edge termination region.

8. The electronic device according to claim 7, further comprising:

a second protection ring having the second electrical conductivity and a doping value lower than a doping value of the edge termination region, the second protection ring extending into the semiconductor body at an end portion of the gate connection terminal.

9. The electronic device according to claim 8, further comprising:

one or more floating regions having the second electrical conductivity, the one or more floating regions extending into the semiconductor body between the first protection ring and the second protection ring.

10. The electronic device according to claim 1, wherein the edge region includes a current spread layer (CSL) extending into a portion of the semiconductor body at the front side, and wherein the CSL has the first electrical conductivity and doping value higher than a doping value of the portion of the semiconductor body in which the CSL extends into.

11. The electronic device according to claim 1, further comprising:

a drain region extending at a rear side, opposite to the front side, of the semiconductor body.

12. The electronic device according to claim 11, wherein the portion of the semiconductor body adjacent and external to the edge termination region is in electrical contact with the drain region.

13. The electronic device according to claim 11, wherein the gate region defines, with portions of the semiconductor body extending below the gate region and having the first electrical conductivity, a first contribution of capacitance between the gate region and the drain region of the electronic device.

14. The electronic device according to claim 13, wherein the capacitive coupling defines a second contribution of the capacitance between the gate region and the drain region which is added to the first contribution.

15. The electronic device according to claim 14, wherein the second contribution is designed with a value such that it triggers a parasitic turn-ON (PTO) phenomenon, during a turn-OFF of the electronic device.

16. The electronic device according to claim 1, wherein an overlap of the edge termination region with the portion of the semiconductor body adjacent and external to the edge termination region, has a value $L_{shield}$ along a reference axis parallel to the front side, which meets the relationship:

$$\frac{\left(1.15\cdot 10^5/m\right)^* Th_{diel}*w_{AA}}{\varepsilon_{diel}} \leq L_{shield} \leq \frac{\left\{2.3\cdot 10^5/m\right\}^* Th^*_{diel}*w_{AA}}{\varepsilon_{diel}}$$

or $$\frac{\left(1\cdot 10^{-6*}F/m^2\right)^* Th_{diel}*w_{AA}}{\varepsilon_{diel}\varepsilon_0} \leq L_{shield} \leq \frac{\left(2\cdot 10^{-6*}F/m^2\right)^* Th_{diel}*w_{AA}}{\varepsilon_{diel}\varepsilon_0}$$

where:

$W_{AA}$ is a maximum extension, along the reference axis, of the active area, the active area having a square shape;

$\varepsilon_{diel}$ is a dielectric constant of the material of the second dielectric layer; and $\varepsilon_0$ is a dielectric constant of vacuum.

17. The electronic device according to claim 1, wherein the edge region includes a capacitive decoupling layer extending into the semiconductor body at the front side laterally to the edge termination region and interposed between the gate connection terminal and the portion of the semiconductor body adjacent and external to the edge termination region, and wherein the capacitive decoupling layer is configured to deplete majority carriers having the second electrical conductivity when the electronic device is in use, and allow establishment of the capacitive coupling.

18. The electronic device according to claim 17, wherein the capacitive decoupling layer has a doping dose of an order of $10^{16}$ ions/cm$^3$, and extends into the semiconductor body with a thickness between 0.2 and 0.4 µm.

19. The electronic device according to claim 1, wherein the electronic device is a vertical conduction MOSFET.

20. The electronic device according to claim 1, wherein the semiconductor body includes Silicon Carbide.

21. A device comprising:

a semiconductor body having a first electrical conductivity type;

an active region in the semiconductor body, the active region including a source region, a source terminal electrically coupled to the source region, a gate region, a body region, and a channel region;

an edge region in the semiconductor body and surrounding the active region, the channel region does not extend into the edge region and is within the active region;

an edge termination region having a second electrical conductivity type, the edge termination region extending in the active region and the edge region, the edge termination region being in electrical contact with the source region and the body region;

a first dielectric layer extending in the active region and the edge region and on the semiconductor body and the edge termination region;

a conductive layer on the first dielectric layer, the conductive layer being spaced from the edge termination region by the first dielectric layer;

a second dielectric layer extending in the active region and the edge region and on the first dielectric layer and the conductive layer; and a gate connection terminal including a first portion on the second dielectric layer and a second portion extending through second dielectric layer to the conductive layer, the gate connection terminal being in electrical contact with the conducive layer and the gate region, the source terminal including a first portion on the second dielectric layer and a second portion extending through the first and second dielectric layers to the source region.

22. The device according to claim 21, further comprising:

an implanted region having the second electrical conductivity type, the implanted region extending in the edge region and underlying the gate connection terminal.

23. A device, comprising:

a semiconductor body having a first electrical conductivity type, the semiconductor body having an active region and an edge region that encircles the active region;

a source region in the active region;

a body region in the active region;

a gate region in the active region;

an edge termination region in the active region and the edge region, the edge termination region having a second electrical conductivity type, the edge termination region electrically coupled to the source region and the body region;

a first dielectric layer extending in the active region and the edge region and on the semiconductor body and the edge termination region;

a conductive layer on the first dielectric layer, the conductive layer being spaced from the edge termination region by the first dielectric layer;

a second dielectric layer extending in the active region and the edge region and on the first dielectric layer and the conductive layer;

a source terminal electrically coupled to the source region, the source terminal including a first portion on the second dielectric layer and a second portion extending through the first and second dielectric layers to the source region, the second portion of the source terminal positioned between the gate region and the conductive layer; and a gate terminal electrically coupled to the conducive layer and the gate region, the gate terminal including a first portion on the second dielectric layer and a second portion extending through second dielectric layer to the conductive layer.

24. The device according to claim 23, wherein the edge termination region encircles the active region.

* * * * *